US011028477B2

(12) United States Patent
Saly et al.

(10) Patent No.: US 11,028,477 B2
(45) Date of Patent: Jun. 8, 2021

(54) BOTTOM-UP GAP-FILL BY SURFACE POISONING TREATMENT

(71) Applicant: Applied Materials, Inc., Santa Clara, CA (US)

(72) Inventors: Mark Saly, Santa Clara, CA (US); Keiichi Tanaka, San Jose, CA (US); Eswaranand Venkatasubramanian, Santa Clara, CA (US); Mandyam Sriram, San Jose, CA (US); Bhaskar Jyoti Bhuyan, San Jose, CA (US); Pramit Manna, Sunnyvale, CA (US); David Thompson, San Jose, CA (US); Andrew Short, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/297,270

(22) Filed: Oct. 19, 2016

(65) Prior Publication Data
US 2017/0114459 A1    Apr. 27, 2017

Related U.S. Application Data

(60) Provisional application No. 62/245,977, filed on Oct. 23, 2015, provisional application No. 62/265,734, filed on Dec. 10, 2015.

(51) Int. Cl.
*C23C 16/04* (2006.01)
*C23C 16/455* (2006.01)
(Continued)

(52) U.S. Cl.
CPC ........ *C23C 16/45527* (2013.01); *C23C 16/02* (2013.01); *C23C 16/04* (2013.01); *C23C 16/045* (2013.01); *C23C 16/345* (2013.01); *C23C 16/402* (2013.01); *C23C 16/45534* (2013.01); *H01L 21/0228* (2013.01); *H01L 21/02274* (2013.01); *H01L 21/76224* (2013.01)

(58) Field of Classification Search
None
See application file for complete search history.

(56) References Cited

U.S. PATENT DOCUMENTS 6,852,635 B2   2/2005  Satta et al.
7,625,820 B1  12/2009  Papasouliotis et al.
(Continued)

FOREIGN PATENT DOCUMENTS

| CN | 104928654 A | 9/2015 |
| KR | 101349993 B1 | 1/2014 |
| TW | 200915481 A | 4/2009 |

OTHER PUBLICATIONS

PCT International Search Report and Written Opinion in PCT/US2016/057671 dated Jan. 26, 2017, 12 pages.
(Continued)

*Primary Examiner* — David P Turocy
(74) *Attorney, Agent, or Firm* — Servilla Whitney LLC

(57) ABSTRACT

Methods for depositing film comprising exposing a substrate surface to an organic-based poisoning agent to preferentially inhibit film growth at the top of a feature relative to the bottom of the feature and depositing a film. The substrate can be exposed to the poisoning agent any number of times to promote bottom-up growth of the film in the feature.

15 Claims, 8 Drawing Sheets

(51) Int. Cl.
*C23C 16/34* (2006.01)
*H01L 21/02* (2006.01)
*C23C 16/02* (2006.01)
*C23C 16/40* (2006.01)
*H01L 21/762* (2006.01)

(56) References Cited

U.S. PATENT DOCUMENTS

| | | | |
|---|---|---|---|
| 8,746,170 | B2 | 6/2014 | Orito et al. |
| 8,808,456 | B2* | 8/2014 | Kato ............... C23C 16/401 |
| | | | 118/716 |
| 9,349,637 | B2* | 5/2016 | Na ............... H01J 37/32009 |
| 9,425,078 | B2* | 8/2016 | Tang ............... H01L 21/76224 |
| 2007/0141779 | A1* | 6/2007 | Abelson ............... H01L 21/314 |
| | | | 438/253 |
| 2009/0232985 | A1 | 9/2009 | Dussarrat ............... C23C 16/402 |
| | | | 427/255.28 |
| 2012/0141676 | A1* | 6/2012 | Sershen ............ C23C 16/45551 |
| | | | 427/255.23 |
| 2012/0244701 | A1 | 9/2012 | Higuchi et al. |
| 2012/0276306 | A1* | 11/2012 | Ueda ............... C23C 16/04 |
| | | | 427/576 |
| 2013/0084700 | A1 | 4/2013 | Swerts et al. |
| 2013/0171822 | A1* | 7/2013 | Chandrashekar ............... |
| | | | H01L 21/28556 |
| | | | 438/675 |
| 2014/0011354 | A1 | 1/2014 | Lei et al. |
| 2014/0363983 | A1* | 12/2014 | Nakano ............ H01L 21/02112 |
| | | | 438/778 |
| 2015/0017794 | A1 | 1/2015 | Takamure et al. |
| 2015/0243545 | A1* | 8/2015 | Tang ............... H01L 21/76224 |
| | | | 438/430 |
| 2016/0056074 | A1* | 2/2016 | Na ............... H01J 37/32009 |
| | | | 438/666 |
| 2016/0056077 | A1 | 2/2016 | Lai et al. |
| 2016/0093528 | A1 | 3/2016 | Chandrashekar et al. |
| 2016/0148800 | A1* | 5/2016 | Henri ............... H01L 21/0228 |
| | | | 438/485 |

OTHER PUBLICATIONS

PCT International Preliminary Report on Patentability in PCT/US2016/057671 dated May 3, 2018, 9 pages.

* cited by examiner

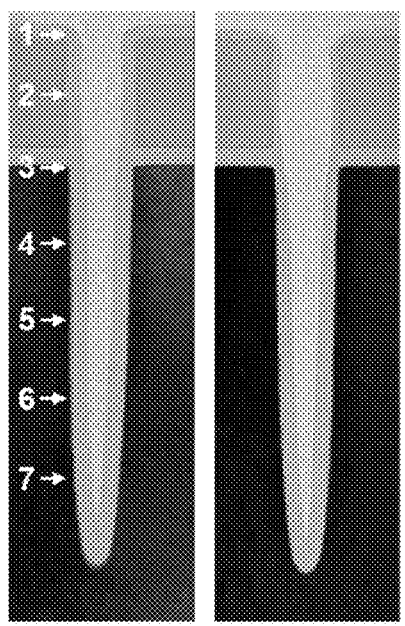
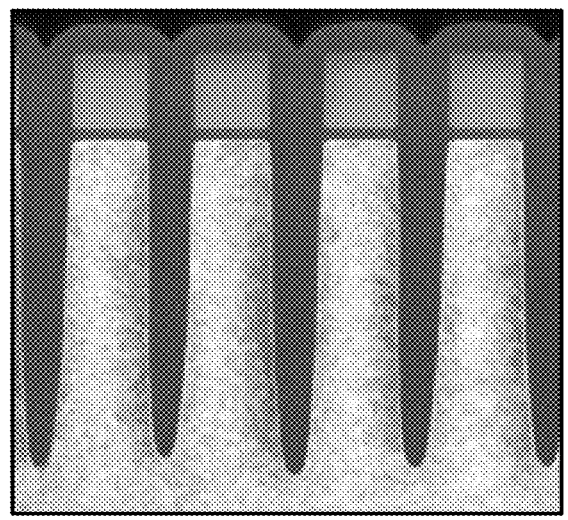
FIG. 13
FIG. 11
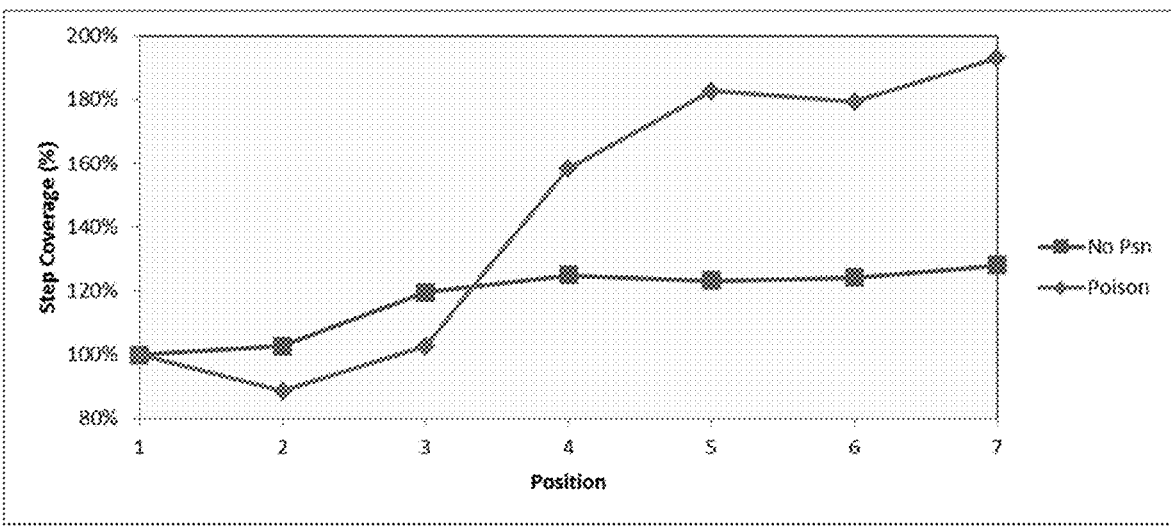
FIG. 12

BOTTOM-UP GAP-FILL BY SURFACE POISONING TREATMENT

CROSS-REFERENCE TO RELATED APPLICATIONS

This application claims priority to U.S. Provisional Application No. 62/245,977, filed Oct. 23, 2015 and U.S. Provisional Application No. 62/265,734, filed Dec. 10, 2015, the entire disclosures of which are hereby incorporated by reference herein.

TECHNICAL FIELD

The present disclosure relates generally to methods of depositing thin films. In particular, the disclosure relates to processes for filling narrow trenches.

BACKGROUND

In microelectronics device fabrication there is a need to fill narrow trenches having aspect ratios (AR) greater than 10:1 with no voiding for many applications. One application is for shallow trench isolation (STI). For this application, the film needs to be of high quality throughout the trench (having, for example, a wet etch rate ratio less than two) with very low leakage. One method that has had past success is flowable CVD. In this method, oligomers are carefully formed in the gas phase which condense on the surface and then "flow" into the trenches. The as-deposited film is of very poor quality and requires processing steps such as steam anneals and UV-cures.

As the dimensions of the structures decrease and the aspect ratios increase post curing methods of the as deposited flowable films become difficult. Resulting in films with varying composition throughout the filled trench. Therefore, there is a need for new methods that can result in bottom up film growth where the as-deposited film is of high quality without any voiding.

SUMMARY

One or more embodiments of the disclosure are directed to processing methods comprising exposing a substrate surface having at least one feature thereon to an organic-based poisoning agent to preferentially poison a top of the feature relative to a bottom of the feature. A film is deposited in the feature in a bottom-up manner.

Additional embodiments of the disclosure are directed to processing methods comprising positioning a substrate surface in a processing chamber. The substrate surface has at least one feature thereon. The at least one feature creates a gap with a bottom, top and sidewalls. The substrate surface is exposed to an organic-based poisoning agent to preferentially inhibit film growth at the top of the feature relative to a bottom of the feature. The substrate surface is sequentially exposed to a precursor and a reactant to deposit a layer in the gap. The precursor and reactant are repeatedly exposed to fill the gap of the feature in a bottom-up manner.

Further embodiments of the disclosure are directed to processing method comprising placing a substrate having a substrate surface into a processing chamber comprising a plurality of sections. Each section of the processing chamber is separated from adjacent sections by a gas curtain. The substrate surface has at least one feature with a top, bottom and sides and an aspect ratio greater than or equal to 10:1. At least a portion of the substrate surface is exposed to a first process condition in a first section of the processing chamber. The first process condition comprises an organic-based poisoning agent to preferentially inhibit film growth at the top of the feature relative to the bottom of the feature. The substrate surface is laterally moved through a gas curtain to a second section of the processing chamber. The substrate surface is exposed to a second process condition in the second section of the processing chamber. The second process condition comprises a silicon precursor. The substrate surface is laterally moved through a gas curtain to a third section of the processing chamber. The substrate surface is exposed to a third process condition in the third section of the processing chamber. The third process condition comprises an oxygen-containing reactant to form a $SiO_2$ film. Exposure to the first section, second section and third section including lateral movement of the substrate surface is repeated to fill the feature.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 11 shows a cross-sectional TEM of features filled with and without poisoning in accordance with one or more embodiment of the disclosure;

FIG. 12 shows a graph of the step coverage as a function of vertical position in FIG. 11; and FIG. 13 shows a TEM image of trenches gap filled in accordance with one or more embodiment of the disclosure.

DETAILED DESCRIPTION

Figure 1:
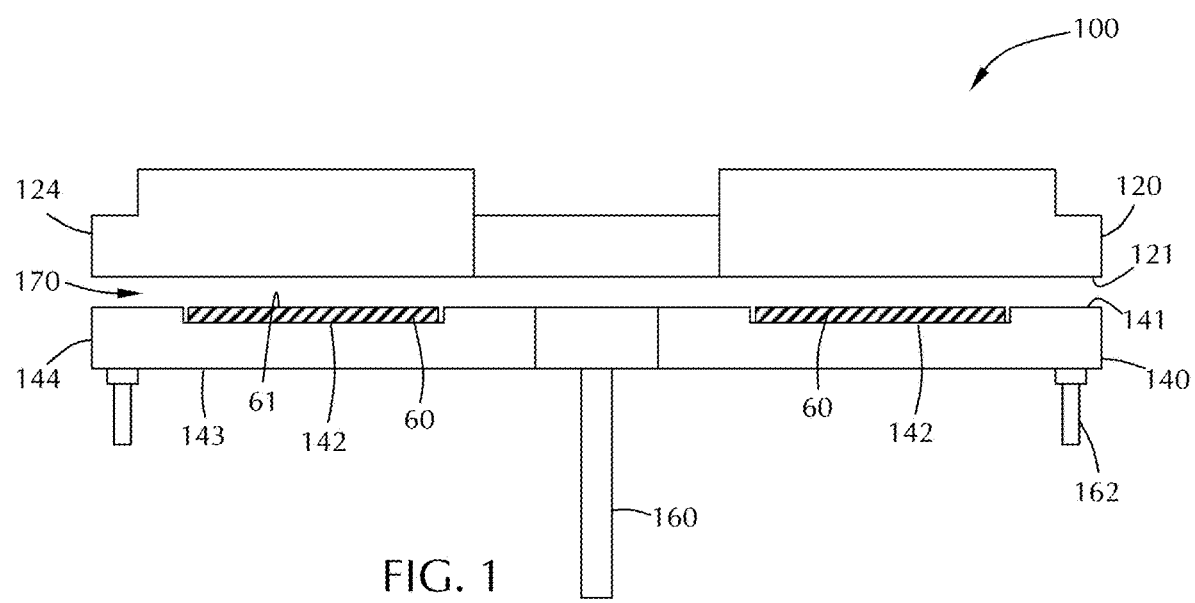
FIG. 1 shows a cross-sectional view of a batch processing chamber in accordance with one or more embodiment of the disclosure.

Before describing several exemplary embodiments of the invention, it is to be understood that the invention is not limited to the details of construction or process steps set forth in the following description. The invention is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

One or more embodiments of the disclosure are directed to methods to poison the top of the trench and top sidewall in order to grow the film in a bottom up manner. Some embodiments of the disclosure provide methods that advantageously fill features with aspect ratios greater than five with a film. One or more embodiments of the disclosure advantageously provide methods of gap-filling features with high throughput and repeatability.

According to one or more embodiments, the method uses an atomic layer deposition (ALD) process. In such embodiments, the substrate surface is exposed to the precursors (or reactive gases) sequentially or substantially sequentially. As used herein throughout the specification, "substantially sequentially" means that a majority of the duration of a precursor exposure does not overlap with the exposure to a co-reagent, although there may be some overlap. As used in this specification and the appended claims, the terms "precursor", "reactant", "reactive gas" and the like are used interchangeably to refer to any gaseous species that can react with the substrate surface.

In one or more embodiments, the gap-fill method is performed using an Atomic Layer Deposition (ALD) process. An ALD process is a self-limiting process where a single layer of material is deposited using a binary (or higher order) reaction. An individual reaction in the ALD process continues until all available active sites on the substrate surface have been reacted. ALD processes can be performed by time-domain or spatial ALD.

In a time-domain process, the processing chamber and substrate are exposed to a single reactive gas at any given time. In an exemplary time-domain process, the processing chamber might be filled with a metal precursor for a time to allow the metal precursor to fully react with the available sites on the substrate. The processing chamber can then be purged of the precursor before flowing a second reactive gas into the processing chamber and allowing the second reactive gas to fully react with the active sites on the substrate. The time-domain process minimizes the mixing of reactive gases by ensuring that only one reactive gas is present in the processing chamber at any given time. At the beginning of any reactive gas step, there is a delay in which the concentration of the reactive species must go from zero to the final predetermined pressure. Similarly, there is a delay in purging all of the reactive species from the process chamber.

In a spatial ALD process, the substrate is moved between different process regions within a single processing chamber. Each of the individual process regions is separated from adjacent process regions by a gas curtain. The gas curtain helps prevent mixing of the reactive gases to minimize any gas phase reactions.

In some spatial ALD processing chambers, there are multiple gas inlet channels which could be used for introduction of different chemicals or plasma gases. Spatially, these channels are separated by inert purging gases and/or vacuum pumping holes forming a gas curtain which separates adjacent processing regions. The gas curtain helps prevent mixing of the reactive gases to minimize any gas phase reactions. There is essentially no, or minimal, mixing of gases from different channels to avoid unwanted gas phase reactions. Wafers moving through these different spatially separated channels get sequential and multiple surface exposures to different chemical or plasma environment and thus layer by layer film growth in spatial ALD mode or surface etching process become possible.

In some embodiments, the processing chamber has modular architectures on gas distribution component and each modular has independent control such as RF or gas flow which enable flexible frequency of gas flow and/or RF exposure, not only as spatial. Embodiments of the disclosure utilize these architectures and comprise first treating the structure with a growth inhibitor (surface poisoning) that is concentrated to the tops and top sides of a feature with a slow reduction of the inhibitor on the surface towards the bottom of the trench. It is believed that this will promote a higher precursor absorption rate at the bottom versus the top. When this condition is met, multiple ALD cycles should lead to bottom up growth. In some cases the poisoning only has to be done once and other cases it might need to be employed every cycle. In most cases, the minimum amount of poisoning treatments would be in the range of about 1 to about 50 cycles.

Some embodiments of the disclosure are directed to film deposition processes using a batch processing chamber, also referred to as a spatial processing chamber. FIG. 1 shows a cross-section of a processing chamber 100 including a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer edge 124 which in the embodiments shown, is substantially round.

The specific type of gas distribution assembly 120 used can vary depending on the particular process being used. Embodiments of the invention can be used with any type of processing system where the gap between the susceptor and the gas distribution assembly is controlled. While various types of gas distribution assemblies can be employed (e.g., showerheads), embodiments of the invention may be particularly useful with spatial gas distribution assemblies which have a plurality of substantially parallel gas channels. As used in this specification and the appended claims, the term "substantially parallel" means that the elongate axis of the gas channels extend in the same general direction. There can be slight imperfections in the parallelism of the gas channels. In a binary reaction, the plurality of substantially parallel gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the processing region through the purge gas P channel(s). A substrate moving from one end of the gas distribution assembly to the other end will be exposed to each of the process gases in turn, forming a layer on the substrate surface.

Figure 2:
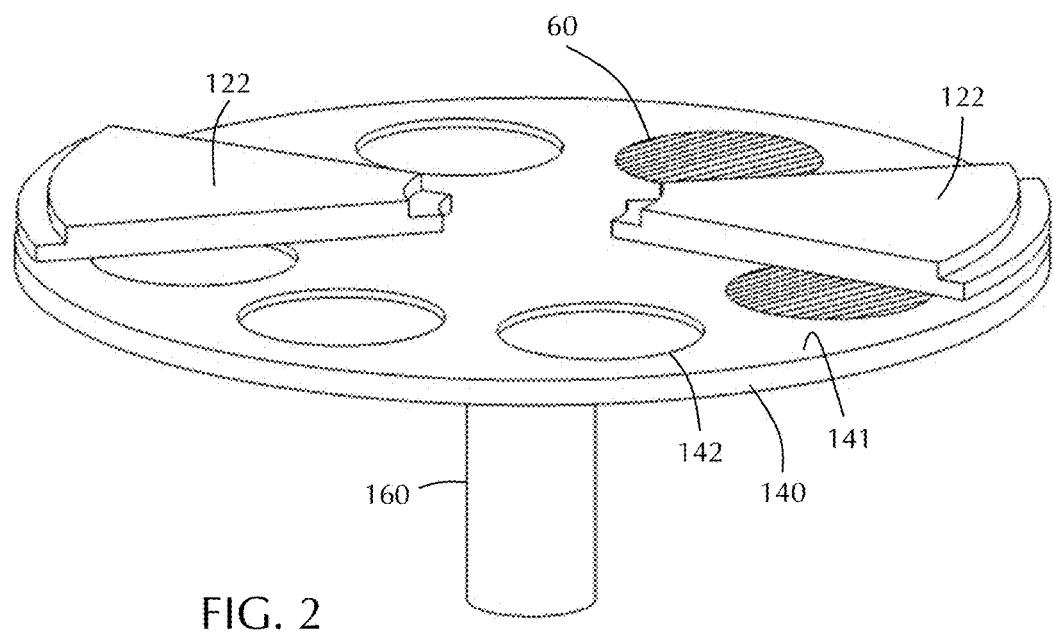
FIG. 2 shows a partial perspective view of a batch processing chamber in accordance with one or more embodiment of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the invention described.

A susceptor assembly 140 is positioned beneath the gas distribution assembly 120. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the substrates 60 being processed. In the embodiment shown in FIG. 1, the recess 142 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm.

The susceptor assembly 140 of FIG. 1 includes a support post 160 which is capable of lifting, lowering and rotating the susceptor assembly 140. The susceptor assembly may include a heater, or gas lines, or electrical components within the center of the support post 160. The support post 160 may be the primary means of increasing or decreasing the gap between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas distribution assembly 120.

In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of substrates 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload substrates 60.

Figure 3:
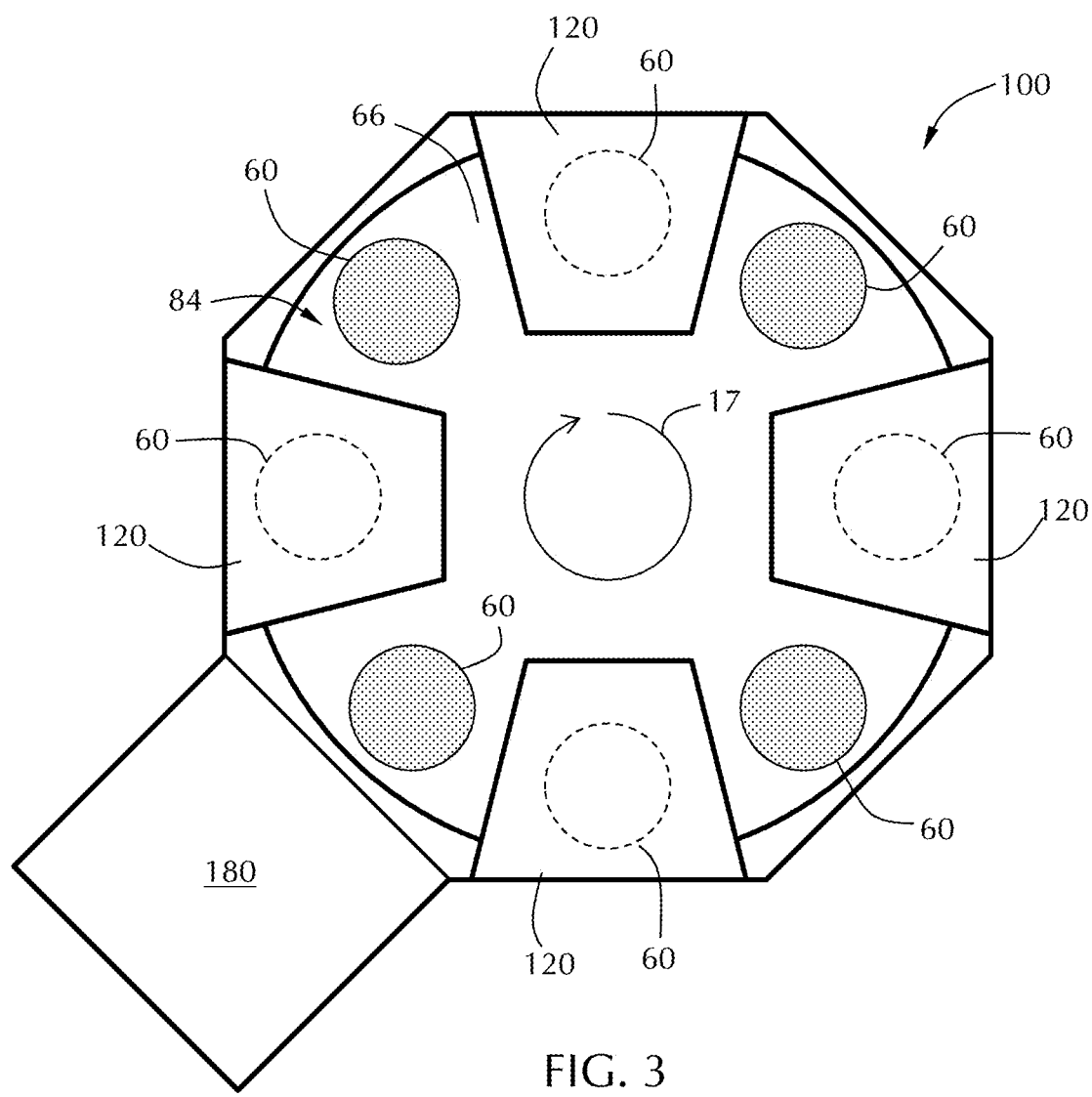
FIG. 3 shows a schematic view of a batch processing chamber in accordance with one or more embodiment of the disclosure.

Processing chambers having multiple gas injectors can be used to process multiple wafers simultaneously so that the wafers experience the same process flow. For example, as shown in FIG. 3, the processing chamber 100 has four gas injector assemblies and four substrates 60. At the outset of processing, the substrates 60 can be positioned between the injector assemblies 30. Rotating 17 the susceptor assembly 140 by 45° will result in each substrate 60 which is between injector assemblies 120 to be moved to an injector assembly 120 for film deposition, as illustrated by the dotted circle under the injector assemblies 120. An additional 45° rotation would move the substrates 60 away from the injector assemblies 30. The number of substrates 60 and gas distribution assemblies 120 can be the same or different. In some embodiments, there are the same numbers of wafers being processed as there are gas distribution assemblies. In one or more embodiments, the number of wafers being processed are fraction of or an integer multiple of the number of gas distribution assemblies. For example, if there are four gas distribution assemblies, there are 4x wafers being processed, where x is an integer value greater than or equal to one. In an exemplary embodiment, the gas distribution assembly 120 includes eight processing regions separated by gas curtains and the susceptor assembly 140 can hold six wafers.

The processing chamber 100 shown in FIG. 3 is merely representative of one possible configuration and should not be taken as limiting the scope of the invention. Here, the processing chamber 100 includes a plurality of gas distribution assemblies 120. In the embodiment shown, there are four gas distribution assemblies (also called injector assemblies 30) evenly spaced about the processing chamber 100. The processing chamber 100 shown is octagonal; however, those skilled in the art will understand that this is one possible shape and should not be taken as limiting the scope of the invention. The gas distribution assemblies 120 shown are trapezoidal, but can be a single circular component or made up of a plurality of pie-shaped segments, like that shown in FIG. 2.

The embodiment shown in FIG. 3 includes a load lock chamber 180, or an auxiliary chamber like a buffer station. This chamber 180 is connected to a side of the processing chamber 100 to allow, for example the substrates (also referred to as substrates 60) to be loaded/unloaded from the chamber 100. A wafer robot may be positioned in the chamber 180 to move the substrate onto the susceptor.

Rotation of the carousel (e.g., the susceptor assembly 140) can be continuous or intermittent (discontinuous). In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing steps between each layer deposition (e.g., exposure to plasma).

Figure 4:
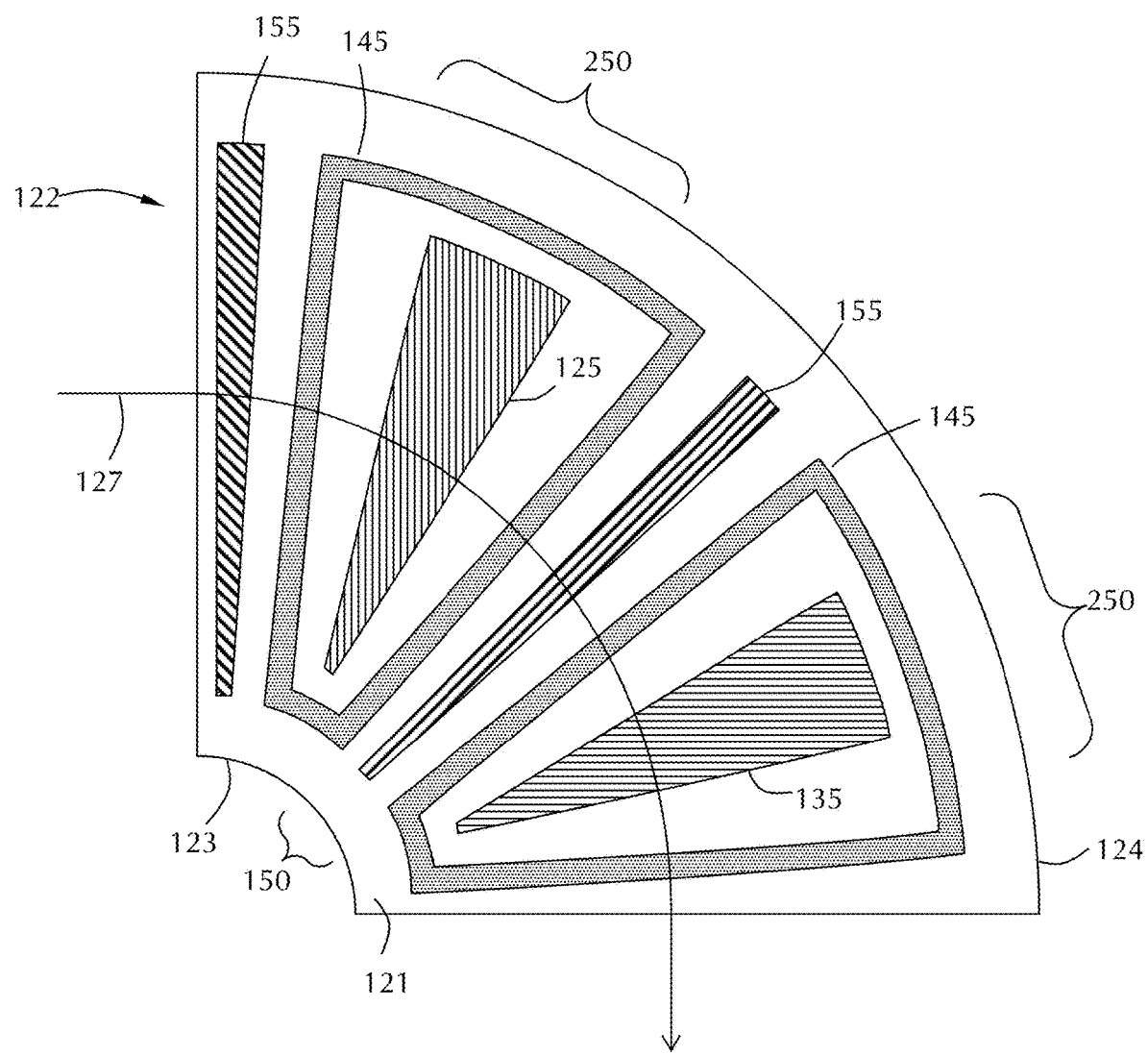
FIG. 4 shows a schematic view of a portion of a wedge shaped gas distribution assembly for use in a batch processing chamber in accordance with one or more embodiment of the disclosure.
Figure 5:
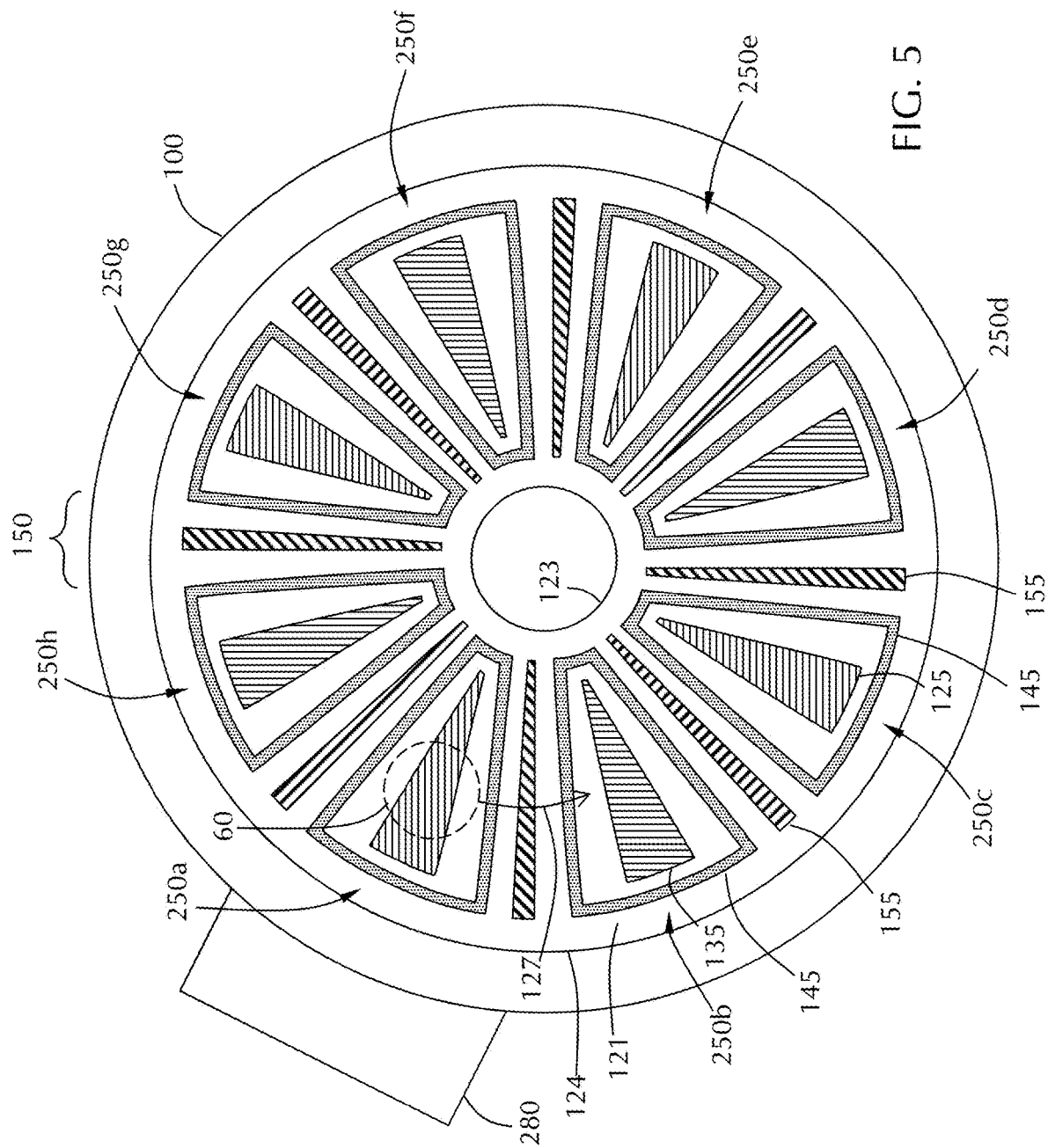
FIG. 5 shows a schematic view of a batch processing chamber in accordance with one or more embodiment of the disclosure.

FIG. 4 shows a sector or portion of a gas distribution assembly 220, which may be referred to as an injector unit 122. The injector units 122 can be used individually or in combination with other injector units. For example, as shown in FIG. 5, four of the injector units 122 of FIG. 4 are combined to form a single gas distribution assembly 220. (The lines separating the four injector units are not shown for clarity.) While the injector unit 122 of FIG. 4 has both a first reactive gas port 125 and a second gas port 135 in addition to purge gas ports 155 and vacuum ports 145, an injector unit 122 does not need all of these components.

Referring to both FIGS. 4 and 5, a gas distribution assembly 220 in accordance with one or more embodiment may comprise a plurality of sectors (or injector units 122) with each sector being identical or different. The gas distribution assembly 220 is positioned within the processing chamber and comprises a plurality of elongate gas ports 125, 135, 145 in a front surface 121 of the gas distribution assembly 220. The plurality of elongate gas ports 125, 135, 145, 155 extend from an area adjacent the inner peripheral edge 123 toward an area adjacent the outer peripheral edge 124 of the gas distribution assembly 220. The plurality of gas ports shown include a first reactive gas port 125, a second gas port 135, a vacuum port 145 which surrounds each of the first reactive gas ports and the second reactive gas ports and a purge gas port 155.

With reference to the embodiments shown in FIG. 4 or 5, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 4 and 5, the wedge shaped reactive gas ports 125, 135 are surrounded on all edges, including adjacent the inner peripheral region and outer peripheral region, by a vacuum port 145.

Referring to FIG. 4, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second gas port 135 and a vacuum port 145. Thus, at the end of the path 127 shown in FIG. 4, the substrate has been exposed to the first reactive gas 125 and the second reactive gas 135 to form a layer. The injector unit 122 shown makes a quarter circle but could be larger or smaller. The gas distribution assembly 220 shown in FIG. 5 can be considered a combination of four of the injector units 122 of FIG. 4 connected in series.

The injector unit 122 of FIG. 4 shows a gas curtain 150 that separates the reactive gases. The term "gas curtain" is used to describe any combination of gas flows or vacuum that separate reactive gases from mixing. The gas curtain 150 shown in FIG. 4 comprises the portion of the vacuum port 145 next to the first reactive gas port 125, the purge gas port 155 in the middle and a portion of the vacuum port 145 next to the second gas port 135. This combination of gas flow and vacuum can be used to prevent or minimize gas phase reactions of the first reactive gas and the second reactive gas.

Referring to FIG. 5, the combination of gas flows and vacuum from the gas distribution assembly 220 form a separation into a plurality of processing regions 250. The processing regions are roughly defined around the individual gas ports 125, 135 with the gas curtain 150 between 250. The embodiment shown in FIG. 5 makes up eight separate processing regions 250 with eight separate gas curtains 150 between. A processing chamber can have at least two processing region. In some embodiments, there are at least three, four, five, six, seven, eight, nine, 10, 11 or 12 processing regions.

During processing a substrate may be exposed to more than one processing region 250 at any given time. However, the portions that are exposed to the different processing regions will have a gas curtain separating the two. For example, if the leading edge of a substrate enters a processing region including the second gas port 135, a middle portion of the substrate will be under a gas curtain 150 and the trailing edge of the substrate will be in a processing region including the first reactive gas port 125.

A factory interface 280, which can be, for example, a load lock chamber, is shown connected to the processing chamber 100. A substrate 60 is shown superimposed over the gas distribution assembly 220 to provide a frame of reference. The substrate 60 may often sit on a susceptor assembly to be held near the front surface 121 of the gas distribution plate 120. The substrate 60 is loaded via the factory interface 280 into the processing chamber 100 onto a substrate support or susceptor assembly (see FIG. 3). The substrate 60 can be shown positioned within a processing region because the substrate is located adjacent the first reactive gas port 125 and between two gas curtains 150a, 150b. Rotating the substrate 60 along path 127 will move the substrate counter-clockwise around the processing chamber 100. Thus, the substrate 60 will be exposed to the first processing region 250a through the eighth processing region 250h, including all processing regions between.

Embodiments of the invention are directed to processing methods comprising a processing chamber 100 with a plurality of processing regions 250a-250h with each processing region separated from an adjacent region by a gas curtain 150. For example, the processing chamber shown in FIG. 5. The number of gas curtains and processing regions within the processing chamber can be any suitable number depending on the arrangement of gas flows. The embodiment shown in FIG. 5 has eight gas curtains 150 and eight processing regions 250a-250h. The number of gas curtains is generally equal to or greater than the number of processing regions.

A plurality of substrates 60 are positioned on a substrate support, for example, the susceptor assembly 140 shown FIGS. 1 and 2. The plurality of substrates 60 are rotated around the processing regions for processing. Generally, the gas curtains 150 are engaged (gas flowing and vacuum on) throughout processing including periods when no reactive gas is flowing into the chamber.

A first reactive gas A is flowed into one or more of the processing regions 250 while an inert gas is flowed into any processing region 250 which does not have a first reactive gas A flowing into it. For example if the first reactive gas is flowing into processing regions 250b through processing region 250h, an inert gas would be flowing into processing region 250a. The inert gas can be flowed through the first reactive gas port 125 or the second gas port 135.

The inert gas flow within the processing regions can be constant or varied. In some embodiments, the reactive gas is co-flowed with an inert gas. The inert gas will act as a carrier and diluent. Since the amount of reactive gas, relative to the carrier gas, is small, co-flowing may make balancing the gas pressures between the processing regions easier by decreasing the differences in pressure between adjacent regions.

Figure 6A:
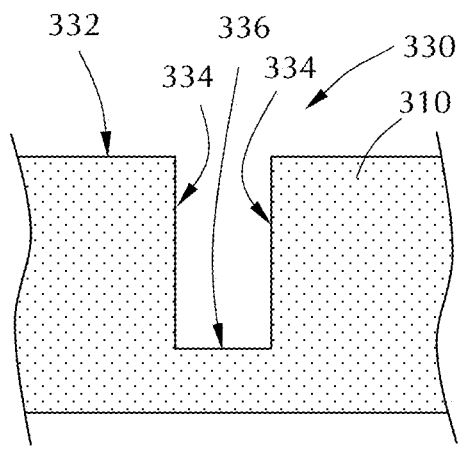
FIGS. 6A through 6C show a gapfill process in accordance with one or more embodiment of the disclosure.
Figure 6B:
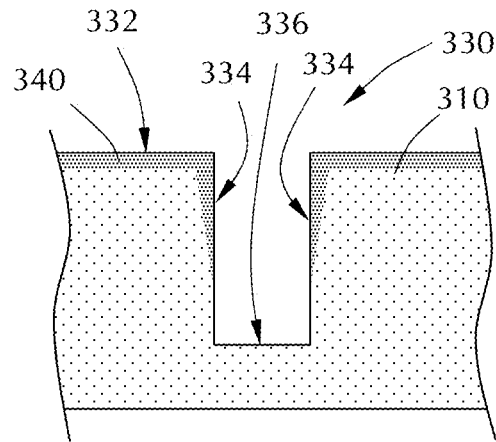
Figure 6C:
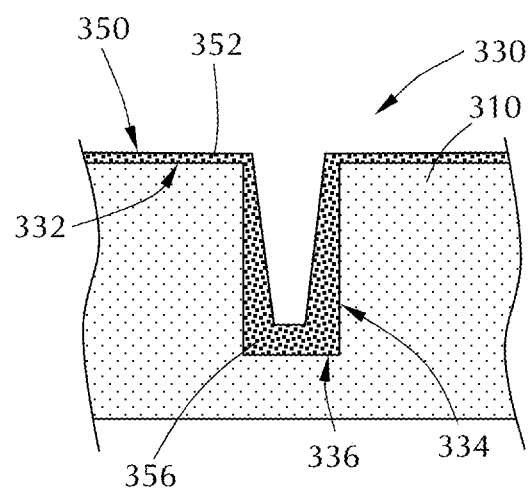

FIGS. 6A through 6C show an illustration of a gap fill process using surface poisoning. Some embodiments of the disclosure comprise first treating the structure with a growth inhibitor (surface poisoning) that is concentrated to the tops and top sides with a slow reduction of the inhibitor on the surface towards the bottom of the trench. This promotes a higher precursor absorption rate at the bottom versus the top of the structure. When this condition is met, multiple ALD cycles result in bottom up growth. In some embodiments, the poisoning is performed once and. In some embodiments, poisoning is employed every process cycle. In some embodiments, the poisoning treatments occur after in the range of about 10 to about 50 cycles.

Some embodiments of the disclosure are directed to methods using a directional plasma to create a poisoning gradient from top to bottom of trench. Direct plasma produces directional ions which can bombard the tops and bottoms of the trench. If the trench has a small opening and long length (AR>10:1) the plasma can be tuned through pressure (0-15 T) and power (50-1000 W) to de-activate the surfaces from the top, down the side, and to the bottom. If the poisoning process is tuned correctly, the poisoning can be stronger on top and weaker on the sides (as shown in FIG. 6B). The film deposition process will determine what type of plasma poisoning to use. For instance, in the case of the ALD of $SiO_2$ using bis(diethylamino)silane (BDEAS) and $O_2$ plasma, employing a $NH_3$ plasma poisoning step before the BDEAS followed by an $O_2$ plasma leads to a reduction in growth. Without being bound to any particular theory of operation, it is believed that the mechanism by which the reduction of growth occurs is from the formation of surface $NH_2$ groups which are not able to react with the amine groups on the BDEAS.

Figure 7:
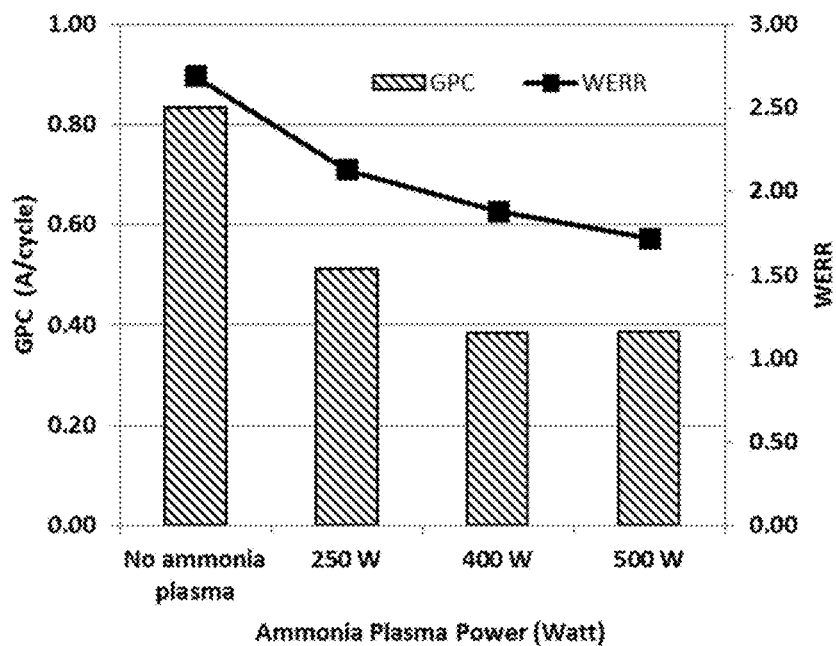
FIG. 7 shows a graph of the growth per cycle and wet etch rate ratio as a function of the ammonia plasma power in accordance with one or more embodiment of the disclosure.

FIG. 7 shows a plot of $NH_3$ plasma power versus growth per cycle (GPC). The pulse train for the process was: 3 seconds $NH_3$ plasma; 20 seconds purge; 1 second BDEAS, 20 seconds purge; 5 seconds $O_2$ plasma; and 20 seconds purge. The substrate temperature was 350° C. The $NH_3$ plasma power was 50-500 W and the pressure was 0.5-10 Torr. The $O_2$ plasma power was 50-500 W and the pressure was 0.5-10 Torr. The purge/carrier gas flow or Ar or $N_2$ was 50-5000 sccms. At an $NH_3$ plasma power of 400 W, the growth rate (0.38 Å/cycle) was half that observed for the BDEAS/$O_2$ plasma process without an $NH_3$ plasma treatment (0.83 Å/cycle).

Figure 8:
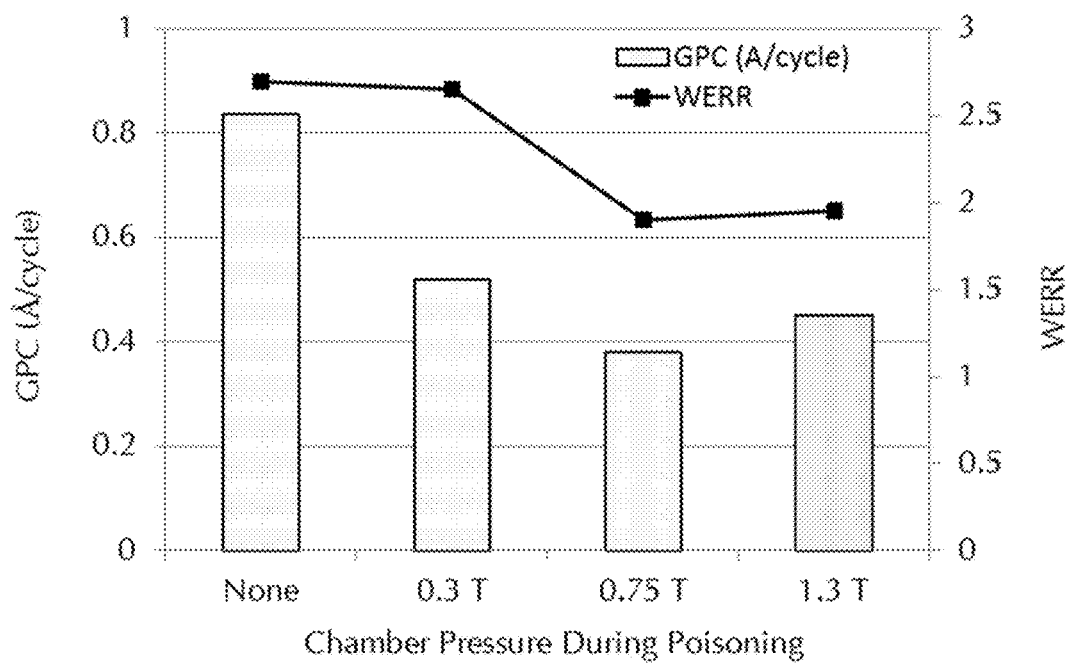
FIG. 8 shows a graph of the growth per cycle and wet etch rate ratio as a function of the chamber pressure during surface poisoning in accordance with one or more embodiment of the disclosure.

The effect of $NH_3$ poisoning pressure with respect to GPC is shown in FIG. 8. It was observed that the thickness of a film slowly increases over 50 cycles from the top to the bottom of a trench. After 100 cycles, a majority of the trench was observed to be filled with no indication of a void or seam present. A similar thickness profile was observed with the top=70.7 Å, top-side=117 Å, and bottom-side=156.0 Å, indicating bottom up growth.

Embodiments of the methods can use various plasma gases to poison the surfaces. Some plasma gases include, but not limited to, $NH_3$, $N_2$, Ar, $H_2O$, $CO_2$, $N_2O$, $H_2$, $N_2+H_2$, hydrazine and combinations thereof.

Some embodiments of the disclosure introduce poisoning molecules into a plasma (e.g., Ar, $N_2$, $H_2$, $NH_3$). Poisoning molecules include, but are not limited to, hydrazine, water, ethylenediamine, ethanolamine, alkanes, amines, alkenes, polyamines, epoxides, alcohols, and combinations thereof. In some embodiments, poisoning the surface comprises exposing the surface to an organic-based poisoning agent. In some embodiments, the organic-based poisoning agent comprises a molecule that contains carbon and hydrogen. In one or more embodiments, the organic-based poisoning agent comprises carbon and hydrogen containing molecules that also comprise one or more of oxygen, nitrogen, sulfur and/or halogen atoms. In some embodiments, the organic-based poisoning agent comprises one or more of ethanolamine (ETA), hexane and/or toluene. In one or more embodiments, the inhibitor comprises greater than or equal to about 10% of an organic-based poisoning agent on a molar basis.

In one or more embodiments, a poisoning molecule is introduced into a plasma with only a sub-saturative dose of the molecule so that there is only enough molecules in the plasma to poison the top features and top-sides of the features (i.e., a top portion of the sides of the features). As used in this regard, a sub-saturative dose occurs where essentially all of (>90%) of the poisoning molecules are consumed prior to reacting with the bottom of the feature (e.g., trench). The sub-saturative dose of some embodiments depends on one or more of the sticking coefficient of the molecule, the concentration and/or radical/ionic lifetime.

In another embodiment, the plasma may be tuned so that sputtering occurs at the top of the structure leading to bottom up growth. Instead of just poisoning the tops and sides, the plasma may be tuned to remove material during the ALD cycles.

In some embodiments, thermal poisoning by sub-saturative precursor dosing can be used. One way to achieve the poisoning effect would be to use a poisoning molecule that can thermally react with the surface (without use of plasma). In this way, the poisoning molecule could be introduced to the surface with a small dose so that there are only enough precursors to react with the tops and side-tops of the structure. After the precursor is used up, there can be no reaction further down the trench. The poisoning molecule of some embodiments poisons the growth of the fill process and reacts quickly with the surface.

For example, a low dose of water can be followed by a silyl halide (e.g., $SiBr_4$) and then $NH_3$ gas to grow SiN in a bottom up manner. Continued cycles of this sequence could be used to completely fill the trench. The low dose of $H_2O$ can make OH on the tops and top sides but not the bottom of the trench. Si—OH bonds are not active towards Si—X (X=halide bond) at temperatures from 150-450° C. If the $SiX_4$ cannot react with the OH groups, then lower growth at the tops and top sides of the structure should lead to bottom up growth.

In some embodiments, using sub-saturative doses of ethylenediamine or other polyamines are used to poison the surface. Examples of poisoning molecules include, but are not limited to, alkyls, polyamines, alcohols, molecules that contain OH and $NH_x$ groups and combinations thereof. Any molecule that poisons the growth of an ALD process can be used.

Some embodiments are used during a CVD process in which a sub-saturative dose is used as a surface poisoning molecule while performing CVD. For example, adding very low doses $H_2O$ to a $TEOS/O_3$ process CVD process might deactivate the tops and side tops of the structures leading to higher growth at the bottom of the trench and hence bottom up gap fill.

In some embodiments, the substrate surface has at least one feature thereon. The feature can be, for example, a trench or pillar. As used in this regard, the term "feature" means any intention surface irregularity. Suitable examples of features include, but are not limited to trenches which have a top, two sidewalls and a bottom, peaks which have a top and two sidewalls. Features can have any suitable aspect ratio (ratio of the depth of the feature to the width of the feature). In some embodiments, the aspect ratio is greater than or equal to about 5:1, 10:1, 15:1, 20:1, 25:1, 30:1, 35:1 or 40:1.

Referring to FIG. 6A, a feature 330 is shown as a trench in the substrate 310. The feature has a top 332, bottom 336 and sidewalls 334. A gap is created between the sidewalls 334. A film deposited on the feature will cover the top 332, bottom 336 and sidewalls 334 of the trench.

One or more embodiments of the disclosure are directed to processing methods comprising poisoning the substrate and depositing a film in a bottom-up manner. As used in this regard, the term "bottom-up manner" means that a film is deposited preferentially in the bottom of the feature relative to the top of the feature.

One or more embodiments include poisoning of the top 332 of the feature 330 to inhibit growth of the deposited film. In FIG. 6A, a substrate with at least one feature 330 is positioned in the processing chamber. The substrate 310 is exposed to a reactant to preferentially poison the top surface 332 to create a poisoned portion 340, as shown in FIG. 6B. The poisoning can be only on the top of the feature or can decrease in intensity toward the bottom of the feature, as shown. The gradient poisoning may occur due to some of the poisoning agent entering the feature.

A film 350 is deposited on the substrate 310 and the feature 330. The thickness of the film 350 at the top 352 is less than the thickness of the film 350 at the bottom 356. The process can be repeated to fill the gap of the feature in a bottom-up manner. The film can be deposited by any suitable technique including, but not limited to, ALD and CVD. In some embodiments, the film is deposited by an ALD process in which the substrate is sequentially exposed to a precursor and a reactant.

FIG. 6C shows a small amount of growth on the top of the feature. In some embodiments, there is substantially no growth on the top of the feature after exposure to the poisoning agent. As used in this regard, substantially no growth means that growth on the top of the feature is less than about 25% of the growth that occurs at the bottom of the feature.

The deposition of the film may result in the poisoning agent being deactivated. Stated differently, the film deposition process may reverse the poisoning process. In some embodiments, the substrate is exposed to the poisoning agent after every cycle of film growth, or before each exposure to the precursor. In some embodiments, the substrate surface is exposed to the poisoning agent after depositing a film with a thickness in the range of about 10 Å to about 50 Å. In some embodiments, poisoning the substrate occurs after sequentially exposing the substrate to the precursor and the reactant in the range of two to about 10 times.

The poisoning agent of some embodiments is a plasma. The plasma poisoning agent can be one or more of $NH_3$, $N_2$, Ar, $H_2O$, $CO_2$, $N_2O$, $H_2$, $N_2+H_2$ and/or hydrazine. The plasma can be a remote plasma or a direct plasma. In some embodiments, the plasma is a directional plasma which is biased to direct ions and/or radicals toward the substrate surface.

In some embodiments, the poisoning agent is introduced into a plasma. For example, a plasma may not sufficiently poison the surface or may not act as a poisoning agent at all. A poisoning agent can be added to the plasma and may be activated by the plasma. The poisoning agent can be added in a sub-saturative amount to help limit the poisoning to the top of the feature or preferentially react with the top of the feature. Stated differently, some embodiments include the introduction of a poisoning molecule within a plasma with only a sub-saturative dose of the molecule so that there is only enough molecules in the plasma to poison the top features and top-sides. If too much of the poisoning agent were added, the entire depth of the feature may become poisoned. The poisoning agent of some embodiments comprises one or more of hydrazine, water, ethylenediamine, ethylenetriamine, ethanolamine, alkyls (e.g., hexane), aromatics (e.g., toluene), amines, alkenes, polyamines and/or alcohols.

In another embodiment, the plasma may be tuned so that sputtering occurs at the top of the structure leading to bottom up growth. Instead of just poisoning the tops and sides, the plasma may be able to be tuned to remove material during the ALD cycles.

In some embodiments, the poisoning agent thermally reacts with the substrate surface. For example, a process that does not use a plasma to either poison the surface or aid in poisoning the surface. The poisoning agent can be introduced in a small amount to react preferentially with the top of the feature.

In some embodiments, the film deposited in the feature has less voids or gaps than a film formed without the poisoning agent. The film deposited in the feature of some embodiments has a wet etch rate ratio less than 2. The wet etch rate ratio (WERR) is measured with 1:100 HF relative to a thermal $SiO_2$ film.

Accordingly, one or more embodiments of the disclosure are directed to processing methods utilizing a batch processing chamber like that shown in FIG. 5. A substrate 60 is placed into the processing chamber which has a plurality of sections 250, each section separated from adjacent section by a gas curtain 150. At least a portion of the substrate surface is exposed to a first process condition in a first section 250a of the processing chamber. The first process condition of some embodiments comprises a poisoning agent.

The substrate surface is laterally moved through a gas curtain 150 to a second section 250b of the processing chamber. The substrate surface is exposed to a second process condition in the second section 250b. The second process condition of some embodiments comprises a precursor that preferentially reacts with the feature in a bottom-up manner.

The substrate surface is laterally moved through a gas curtain 150 to a third section 250c of the processing chamber. The substrate surface can then be exposed to a third process condition in the third section 250c. The third process condition of some embodiments comprises a reactant that reacts with the precursor that has chemisorbed to the feature so that a film is formed in a bottom-up manner.

In some embodiments, the substrate is exposed to additional second process conditions and third process conditions to form a film with a predetermined film thickness. In some embodiments, the substrate is exposed to additional first process conditions to repeatedly poison the substrate surface.

Examples

Figure 9:
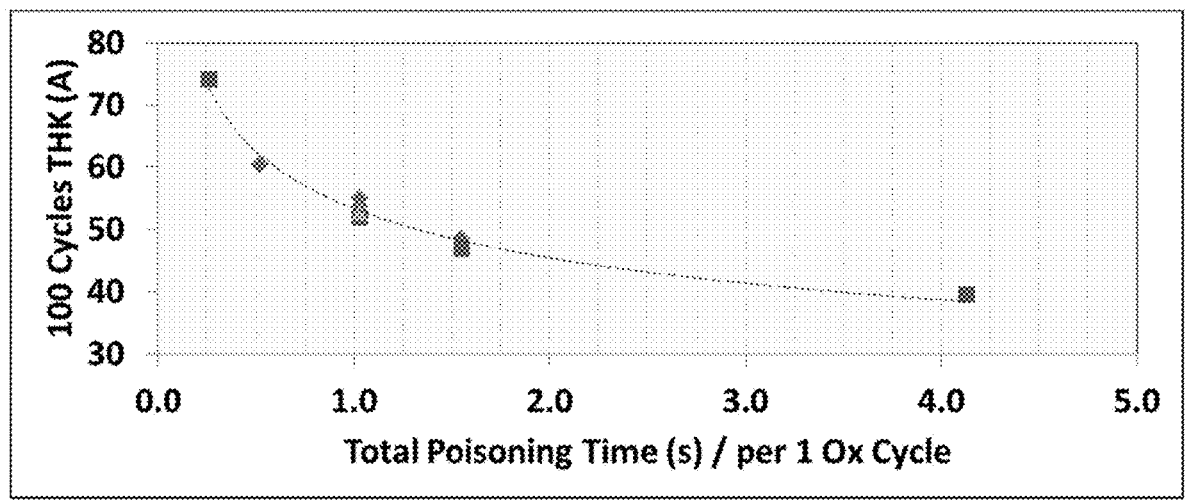
FIG. 9 shows graph of the film thickness as a function of poisoning time in accordance with one or more embodiment of the disclosure.

The effect of $NH_3$ plasma exposure time with respect to thickness at fixed deposition cycles (100 cycles) on a spatial ALD processing chamber is shown in FIG. 9. This example was implemented as one poisoning exposure to one deposition cycle.

Figure 10:
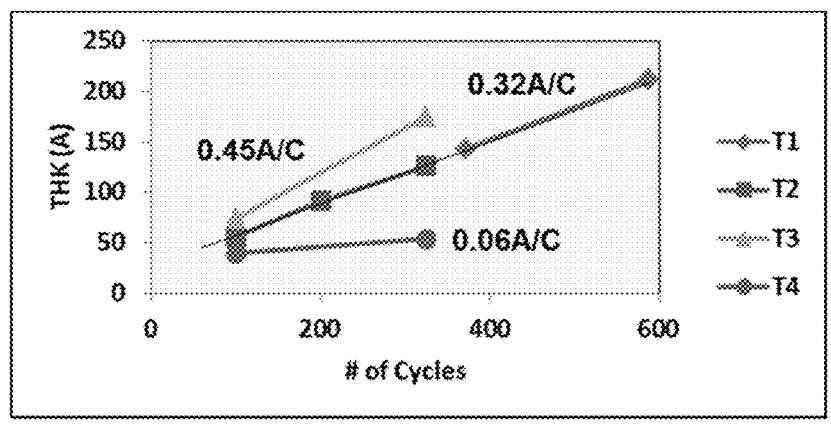
FIG. 10 shows a graph of the film thickness as a function of exposure time and growth per cycle in accordance with one or more embodiment of the disclosure.

FIG. 10 shows a graph of the poisoning effectiveness for growth per cycle (GPC) thickness for samples with varying poisoning exposure times. The lowest GPC was observed with effective exposure to poisoning on blanket wafers for 4 sec. The GPC at this exposure time was less than 0.1 Å per cycle.

FIG. 11 shows cross sectional TEM images of film deposited with only 100 cycles. The thickness of the film slowly increased from the top to the bottom. FIG. 12 shows the measured thickness from top to bottom and converted to step coverage %, where a flat top surface has 100% coverage. The data showed more poisoning on top of the structure.

FIG. 13 shows a TEM of a film deposited on the structure which completely fills the trench. There were 300 deposition cycles and no indication of any voids or seams throughout the trench.

Silicon nitride films were grown on silicon and silicon oxide surfaces using $N_2$ plasma, ethylendiamine (EDA) and ethanolamine (ETA) as the organic-based poisoning agents. The samples were exposed to the growth inhibitor followed by a cycle of hexachlorodisilane (HCDS)/$NH_3$ plasma for 150 cycles. The film growths are summarized in Table 1.

TABLE 1

| Growth Inhibitor | Si Surface (Å) | SiO$_2$ Surface (Å) |
| --- | --- | --- |
| No Inhibitor | 91.21 | 94.51 |
| 100 W N$_2$ Plasma | 60.43 | 63.33 |
| EDA, 200 W | 72.00 | 75.10 |
| ETA, no plasma | 77.21 | 68.46 |
| ETA, 100 W | 23.62 | 11.94 |

The ethanolamine inhibitor showed a reduction in growth of about 87%.

Silicon nitride films were grown on silicon and silicon oxide surfaces using ETA as an inhibitor with varying plasma power. Deposition was performed using HCDS/$NH_3$ plasma. The growth per cycle (GPC) was measured and is summarized in Table 2.

TABLE 2

| Plasma Power | Si Surface (Å/cycle) | SiO$_2$ Surface (Å/cycle) |
| --- | --- | --- |
| No Plasma | 0.51 | 0.46 |
| 25 W | 0.52 | 0.46 |
| 50 W | 0.13 | 0.08 |
| 100 W | 0.16 | 0.08 |
| 200 W | 0.20 | 0.11 |
| 300 W | 0.35 | 0.12 |

It was observed that ETA caused conformal inhibition from the top to the bottom of the trench indicating that inhibition with ETA can be controlled with sub-saturative amounts.

The inhibition ability of ETA was evaluated at sub-saturative amounts at various temperatures. ETA was delivered to the surface for 0.1 second. A SiN film was deposited on silicon and silicon oxide surfaces using 150 cycles of HCDS/$NH_3$ plasma (100 W). Results are summarized in Table 3.

TABLE 3

| Temperature | Si Surface (Å) | SiO$_2$ Surface (Å) |
| --- | --- | --- |
| No ETA | 61.5 | 64.5 |
| 30° C. | 34.5 | 27.0 |
| 40° C. | 31.5 | 24.0 |
| 50° C. | 25.5 | 16.5 |

Silicon nitride films were deposited by HCDS/$NH_3$ plasma (100 W) after exposing the surfaces to hexane and nitrogen plasma inhibition at various plasma powers. The film growth after 150 cycles was measured. The deposition temperature was 350° C. Results are summarized in Table 4.

TABLE 4

| Plasma | Si Surface (Å) | SiO$_2$ Surface (Å) |
| --- | --- | --- |
| No Plasma | 78.0 | 81.0 |
| 200 W - no hexane | 61.5 | 64.5 |
| 25 W | 76.72 | 76.43 |
| 50 W | 51.69 | 55.34 |
| 100 W | 54.59 | 59.09 |
| 200 W | 65.93 | 65.57 |
| 300 W | 91.86 | 81.51 |

Silicon nitride films were deposited after exposure to hexane and argon plasma as an inhibitor at different plasma powers. After inhibition, 150 cycles of HCDS/$NH_3$ plasma (100 W) were deposited at 350° C. and the thickness was measured. Results are summarized in Table 5.

TABLE 5

| Plasma | Si Surface (Å) | SiO$_2$ Surface (Å) |
| --- | --- | --- |
| No Plasma | 77.82 | 79.49 |
| 200 W - no hexane | 50.40 | 54.35 |
| 50 W | 38.16 | 42.13 |
| 100 W | 38.27 | 36.72 |
| 200 W | 40.00 | 39.70 |
| 300 W | 45.03 | 45.32 |

Silicon nitride films were deposited after exposure to hexane and argon plasma as an inhibitor at different chamber pressures. After inhibition, 150 cycles of HCDS/$NH_3$ plasma (100 W) were deposited at 350° C. and the thickness was measured. Results are summarized in Table 6.

TABLE 6

| Plasma | Si Surface (Å) | SiO$_2$ Surface (Å) |
|---|---|---|
| 1 Torr | 53.53 | 54.72 |
| 3.5 Torr | 38.27 | 36.72 |
| 7.5 Torr | 41.19 | 38.76 |

Silicon nitride films were deposited after exposure to hexane and argon plasma as an inhibitor at different plasma powers. After inhibition, 150 cycles of HCDS/NH$_3$ plasma (100 W) were deposited at 350° C., 3.5 Torr. The thickness of the film as a function of depth in a trench was measured and the slope determined. A greater slope indicated a thicker film at the bottom of the trench. Results are summarized in Table 7.

TABLE 7

| Plasma | Slope of Thickness |
|---|---|
| 200 W Ar - no hexane | 0.6657 |
| 100 W | 4.4635 |
| 200 W | 2.6030 |
| 300 W | 2.2101 |

Silicon nitride films were deposited after exposure to hexane and argon plasma (100 W) as an inhibitor at different pressures. After inhibition, 150 cycles of HCDS/NH$_3$ plasma (100 W) were deposited at 350° C. The thickness of the film as a function of depth in a trench was measured and the slope determined. A greater slope indicated a thicker film at the bottom of the trench. Results are summarized in Table 8.

TABLE 8

| Pressure | Slope of Thickness |
|---|---|
| 1 Torr | 0.9887 |
| 3.5 Torr | 4.4635 |
| 7.5 Torr | 3.0025 |

Silicon nitride films were deposited by HCDS/NH$_3$ plasma (100 W) after exposing the surfaces to toluene and nitrogen plasma inhibition at various plasma powers. The film growth after 150 cycles was measured The deposition temperature was 350° C. Results are summarized in Table 9.

TABLE 9

| Plasma | Si Surface (Å) | SiO$_2$ Surface (Å) |
|---|---|---|
| No Plasma | 77.82 | 79.49 |
| 200 W - no toluene | 61.50 | 64.50 |
| 100 W | 50.42 | 55.40 |
| 200 W | 60.29 | 67.60 |
| 300 W | 73.81 | 70.32 |

Silicon nitride films were deposited after exposure to toluene and argon plasma as an inhibitor at different plasma powers. After inhibition, 150 cycles of HCDS/NH$_3$ plasma (100 W) were deposited at 350° C. and the thickness was measured. Results are summarized in Table 10.

TABLE 10

| Plasma | Si Surface (Å) | SiO$_2$ Surface (Å) |
|---|---|---|
| No Plasma | 77.82 | 79.49 |
| 200 W - no toluene | 50.40 | 54.35 |

TABLE 10-continued

| Plasma | Si Surface (Å) | SiO$_2$ Surface (Å) |
|---|---|---|
| 100 W | 33.51 | 40.42 |
| 200 W | 34.05 | 39.00 |
| 300 W | 42.44 | 48.84 |

Silicon nitride films were deposited after exposure to toluene and argon plasma as an inhibitor at different plasma powers. After inhibition, 150 cycles of HCDS/NH$_3$ plasma (100 W) were deposited at 350° C., 3.5 Torr. The thickness of the film as a function of depth in a trench was measured and the slope determined. A greater slope indicated a thicker film at the bottom of the trench. Results are summarized in Table 11.

TABLE 11

| Plasma | Slope of Thickness |
|---|---|
| 200 W Ar - no hexane | 0.6657 |
| 100 W | 4.5573 |
| 200 W | 4.5649 |
| 300 W | 3.0742 |

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate is moved relative to the gas distribution plate, or vice-versa.

In embodiments, where one or more of the parts of the methods takes place in one chamber, the process may be a spatial ALD process. Although one or more of the chemistries described above may not be compatible (i.e., result in reaction other than on the substrate surface and/or deposit on the chamber), spatial separation ensures that the reagents are not exposed to each in the gas phase. For example, temporal ALD involves the purging the deposition chamber. However, in practice it is sometimes not possible to purge all of the excess reagent out of the chamber before flowing in additional regent. Therefore, any leftover reagent in the chamber may react. With spatial separation, excess reagent does not need to be purged, and cross-contamination is limited. Furthermore, a lot of time can be required to purge a chamber, and therefore throughput can be increased by eliminating the purge step.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A processing method comprising:
exposing a substrate surface having at least one feature thereon to a plasma comprising an organic-based poisoning agent to preferentially poison a top of the at least one feature relative to a bottom of the at least one feature, the organic-based poisoning agent selected from the group consisting of ethanolamine (ETA), hexane, and toluene, the plasma generated in an environment having a pressure in a range of from 0 Torr to 15 Torr via at least one source with a power in a range of from 50 W to 1000 W, the at least one feature having an aspect ratio greater than or equal to 10:1; and
depositing a film comprising silicon in the at least one feature in a bottom-up manner, such that growth on the top of the at least one feature is less than about 25% of the growth that occurs at the bottom of the feature after exposure to the organic-based poisoning agent and such that there are no voids or seams present in the at least one feature.

2. The method of claim 1, wherein depositing the film in the at least one feature comprises sequentially exposing the substrate surface to a precursor and a reactant.

3. The method of claim 2, wherein exposing the substrate surface to the poisoning agent occurs before each exposure to the precursor.

4. The method of claim 1, wherein the substrate surface is exposed to the poisoning agent after depositing a film with a thickness in the range of about 10 Å to about 50 Å.

5. The method of claim 1, wherein the plasma comprises one or more of $NH_3$, $N_2$, Ar, $H_2O$, $CO_2$, $N_2O$, $H_2$ and/or hydrazine.

6. The method of claim 1, wherein the poisoning agent is present in the plasma in a sub-saturative amount.

7. The method of claim 1, wherein the organic-based poisoning agent thermally reacts with the surface.

8. The method of claim 7, wherein the organic-based poisoning agent is introduced in a small amount to react preferentially with the top of the at least one feature.

9. The method of claim 1, further comprising repeating the exposure to the organic-based poisoning agent and the film deposition to fill the at least one feature.

10. The method of claim 9, wherein the film deposited in the at least one feature has a wet etch rate ratio less than 2.

11. A processing method comprising:
positioning a substrate surface in a processing chamber, the substrate surface having at least one feature thereon, the at least one feature creating a gap with a bottom, top and sidewalls, and having an aspect ratio greater than or equal to 10:1;
exposing the substrate surface to a plasma comprising an organic-based poisoning agent to preferentially inhibit film growth at the top of the at least one feature relative to a bottom of the at least one feature, the organic-based poisoning agent selected from the group consisting of ethanolamine (ETA), hexane, and toluene, the plasma generated in an environment having a pressure in a range of from 0 Torr to 15 Torr via at least one source with a power in a range of from 50 W to 1000 W;
sequentially exposing the substrate surface to a precursor and a reactant to deposit a layer in the gap; and
repeating exposure to the precursor and reactant to fill the gap of the at least one feature in a bottom-up manner, such that growth on the top of the at least one feature is less than about 25% of the growth that occurs at the bottom of the feature after exposure to the organic-based poisoning agent and such that there are no voids or seams present in the at least one feature.

12. The processing method of claim 11, wherein the plasma is a directional plasma.

13. The processing method of claim 11, wherein poisoning the substrate occurs after sequentially exposing the substrate to the precursor and the reactant in the range of two to about 10 times.

14. The processing method of claim 11, wherein the substrate surface is exposed to the organic-based poisoning agent prior to each exposure to the precursor.

15. A processing method comprising:
placing a substrate having a substrate surface into a processing chamber comprising a plurality of sections, each section separated from adjacent sections by a gas curtain, the substrate surface having at least one feature with a top, bottom and sides and an aspect ratio greater than or equal to 10:1;
exposing at least a portion of the substrate surface to a first process condition in a first section of the processing chamber, the first process condition comprising a plasma comprising an organic-based poisoning agent to preferentially inhibit film growth at the top of the at least one feature relative to the bottom of the at least one feature, such that growth on the top of the at least one feature is less than about 25% of the growth that occurs at the bottom of the feature after exposure to the organic-based poisoning agent and such that there are no voids or seams present in the at least one feature, the organic-based poisoning agent selected from the group consisting of ethanolamine (ETA), hexane, and toluene, the plasma generated in an environment having a pressure in a range of from 0 Torr to 15 Torr via at least one source with a power in a range of from 50 W to 1000 W;
laterally moving the substrate surface through a gas curtain to a second section of the processing chamber;
exposing the substrate surface to a second process condition in the second section of the processing chamber, the second process condition comprising silicon precursor;
laterally moving the substrate surface through a gas curtain to a third section of the processing chamber;
exposing the substrate surface to a third process condition in the third section of the processing chamber, the third process condition comprising an oxygen-containing reactant to form a $SiO_2$ film; and
repeating exposure to the first section, second section and third section including lateral movement of the substrate surface to fill the at least one feature.

* * * * *